United States Patent [19]

Small et al.

[11] Patent Number: 4,922,137
[45] Date of Patent: May 1, 1990

[54] PROGRAMMABLE SEQUENCE GENERATOR

[75] Inventors: Jeffrey A. Small; Mark D. Brown; John A. Vincent, all of Rochester, N.Y.

[73] Assignee: Eastman Kodak Company, Rochester, N.Y.

[21] Appl. No.: 362,293

[22] Filed: Jun. 6, 1989

Related U.S. Application Data

[63] Continuation of Ser. No. 194,778, May 17, 1988, abandoned.

[51] Int. Cl.$^5$ ............... H03K 19/00; H03K 19/02
[52] U.S. Cl. ................... 307/480; 307/269; 307/465; 328/63; 328/72; 377/78
[58] Field of Search ............... 328/63, 72, 15; 307/465, 468, 475, 269, 480, 202.1; 340/825.83; 364/716; 377/64, 78

[56] References Cited

U.S. PATENT DOCUMENTS 4,506,341  3/1985  Kalter et al. ............... 364/716
4,858,178  8/1989  Breuninger ............... 307/465

Primary Examiner—Stanley D. Miller
Assistant Examiner—Timothy P. Callahan
Attorney, Agent, or Firm—Raymond L. Owens

[57] ABSTRACT

A programmable, UV erasable integrated circuit for the generation of various timing sequences. It includes one AND plane, two OR planes, scan path pipeline registers to allow programming and reading, two counters, and a block of high speed logic which runs at an integer multiple of the clock rate of the pipeline registers. The high speed logic also includes a means for smoothly adjusting the positions of various edges of output signals by changing external resistors.

4 Claims, 6 Drawing Sheets

PROGRAMMABLE SEQUENCE GENERATOR

CROSS REFERENCE TO RELATED APPLICATION

This is a continuation of the earlier filed application Serial No. 194,778 filed May 17, 1988 abandoned.

FIELD OF THE INVENTION

This invention relates to timing sequence generators for producing timing signals for digital systems used for imaging applications.

DESCRIPTION OF THE PRIOR ART

In product development, system timing requirements are often not fully known at the outset. Yet some means of generating timing signals must be selected to initiate the design. Timing signal requirements usually change during the course of the development cycle as components change or system problems are encountered. Implementing these changes can be difficult, especially if extensive changes are made. A flexible sequence generator for generating timing or clock signals which allows changes to be easily made in such signals is thus very useful. Further, since the timing requirements are often the last thing to be completed, a sequence generator which can quickly implement different timing signals in a cost effective manner is important.

In many imaging systems such as those employing CCD image sensors, a variety of timing or clock signals must be generated. Some signals are relatively slow, with few transitions. Some signals occur only for specific conditions, such as a particular combination of input signals. Other signals are faster signals with regular patterns of transitions. These can be quite complex with many different transition rates. Sometimes, the positioning of the faster clock signals in the system is critical with respect to each other and other slower signals. To produce this variety of signals often requires a number of different types of integrated circuits. This can create excessive demand on system power supplies. (The term integrated circuit as used in this disclosure refers to a device with a number of active components that is formed on a single piece of semiconductor crystal called a chip.)

There are many techniques available for deriving timing logic. One of the more flexible approaches is to use programmable logic devices (PLDs). These devices are readily available and allow changes to be easily implemented. However, due to the number and variety of types of signals needed in many systems, these PLDs are somewhat restrictive for systems development and several different types are usually needed to produce the required timing signals. In particular, synthesizing the high speed clocks needed to clock the CCD image output register and the system video processing circuitry places heavy demands on the speed of the PLDs required for this task. Further, to satisfy critical timing relationships between signals requires additional logic. This is a disadvantage in cost-sensitive product applications.

SUMMARY OF THE INVENTION

Accordingly, it is an object of this invention to provide a single integrated circuit for generating timing signals which solves the above mentioned difficulties. This object is achieved in a programmable integrated circuit for use with an area image sensor or the like comprising:

(a) a first pipeline register responsive to a plurality of external signals for providing word line signals;

(b) at least one EPROM transistor array responsive to the word line signals for selectively providing a plurality of different NAND or NOR functions of the word lines to produce output signals; and (c) high speed logic responsive to the output signals to selectively produce timing signals.

The following are features and advantages of this invention.

A single integrated circuit having one or more field-programmable NAND or NOR plane arrays can selectively generate timing signals. Circuitry in accordance with this invention includes pipeline register circuits coupled to the one or more field-programmable NOR plane arrays which increases data throughput within the integrated circuit.

Another feature is the provision of a single integrated circuit with programmable arrays which control high speed logic. The high speed logic can run at integer multiples of the arrays' operating speed. The high speed clocks are derived in a manner obviating the necessity of a special high speed PLD for creating the high speed signals or requiring the entire circuit to run at a higher clock rate dictated by the high speed clocks.

Another feature is to provide an analog delay circuit which can change the positioning of rising or falling edges of timing signals.

A unique aspect of this invention is the incorporation of programmable logic with fixed logic to provide multi-dimensional (for example, rows and columns) output signals typically used in imaging systems or memory control systems. By including this logic in a single integrated circuit, a significant cost reduction is realized in the final product because the total part count is reduced. Furthermore, the number of potential applications of the product may increase due to increased circuit density and a reduction in weight, size and power requirements.

Another feature of this invention is the inclusion of pipeline registers, each having one or more scan-in D flip flops between and around programmable EPROM arrays. These registers provide easy implementation of the following functions: Data may be serially scanned into these registers in order to program the EPROM planes. The programmed state of the EPROM planes may also be scanned out by these registers. In normal chip operation, this pipelining between the programmable EPROM arrays facilitates faster data rates and greater complexity in the generation of programmed logic functions. Devices currently available often require the data to pass through at least two arrays (programmable or fixed) before being latched.

DESCRIPTION OF THE INVENTION

Figure 1:
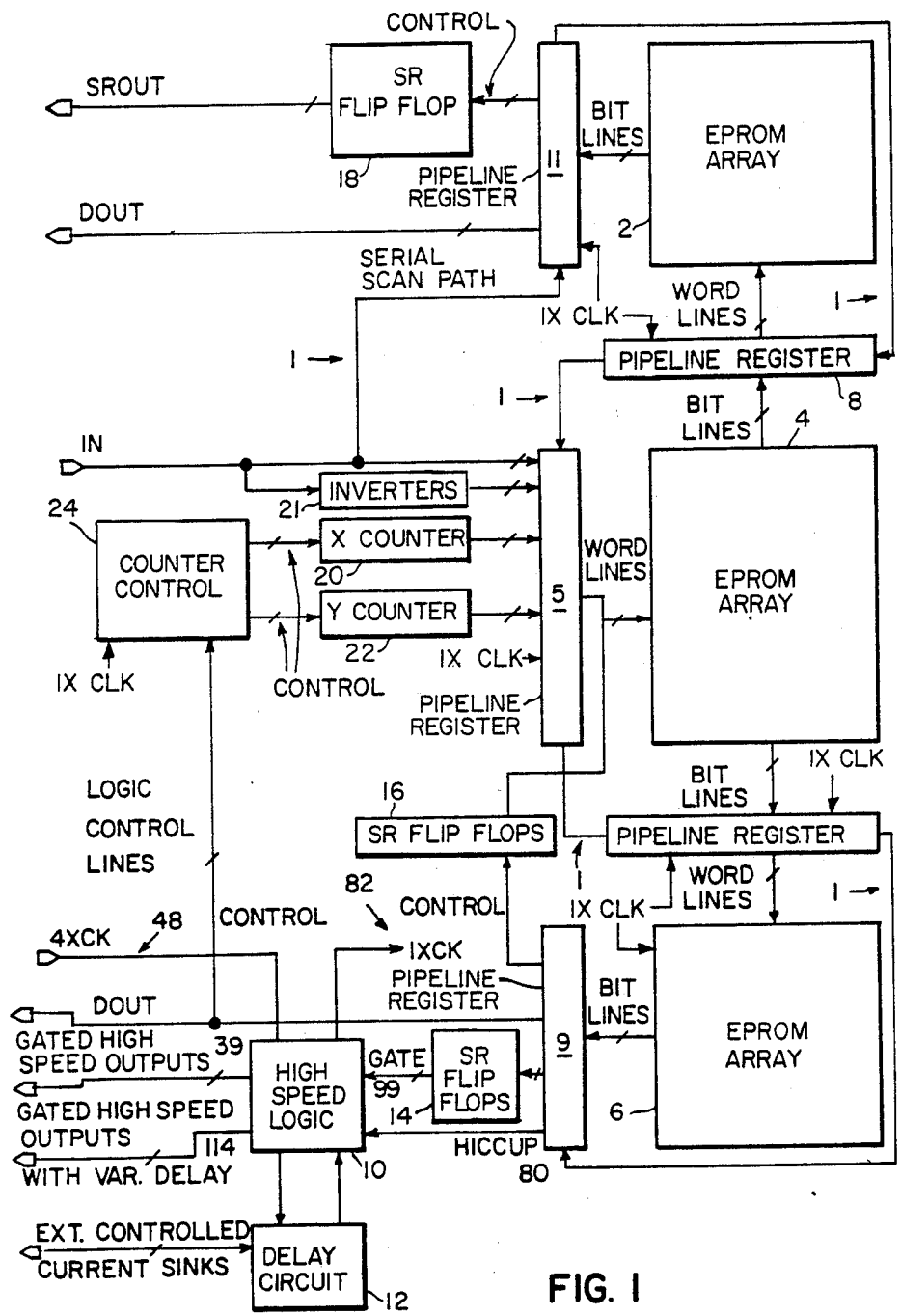
FIG. 1 is a block diagram illustrating one embodiment of the invention.

Before turning to FIG. 1, the following is a general description of a programmable integrated circuit device (sequencer) in accordance with this invention. In order to increase data throughout, a plurality of pipeline registers are coupled to the EPROM array(s) in a manner which is described in detail below. The operation of the sequencer is changed by reprogramming the EPROM arrays. EPROM arrays are well known in the art. See for example, U.S. Pat. No. 4,124,899.

Turning to FIG. 1, a programmable integrated circuit device includes three EPROM arrays 2, 4, and 6 which are the equivalent of two AND-OR Eraseable Programmable Logic Devices (EPLDs) surrounded by pipeline registers 5, 7, 8, 9, and 11. In addition, the integrated circuit device comprises counter control 24, counters 20 and 22, SR flip flops 14, 16 and 18, high speed logic 10, analog delay circuits 12, and inverters 21. A state machine is formed by the EPROM arrays 4 and 6 and SR flip flops 16. EPROM arrays 4 and 6 also provide the decoding to the counter control 24 and high speed logic circuits 10. The external input signals, IN, are brought into the integrated circuit. DOUT signals are provided by the pipeline register circuit 9. The EPROM arrays 2 and 4 in conjunction with SR flip flops 18 and pipeline registers 11 produce the output signals SROUT and DOUT'.

Figure 2:
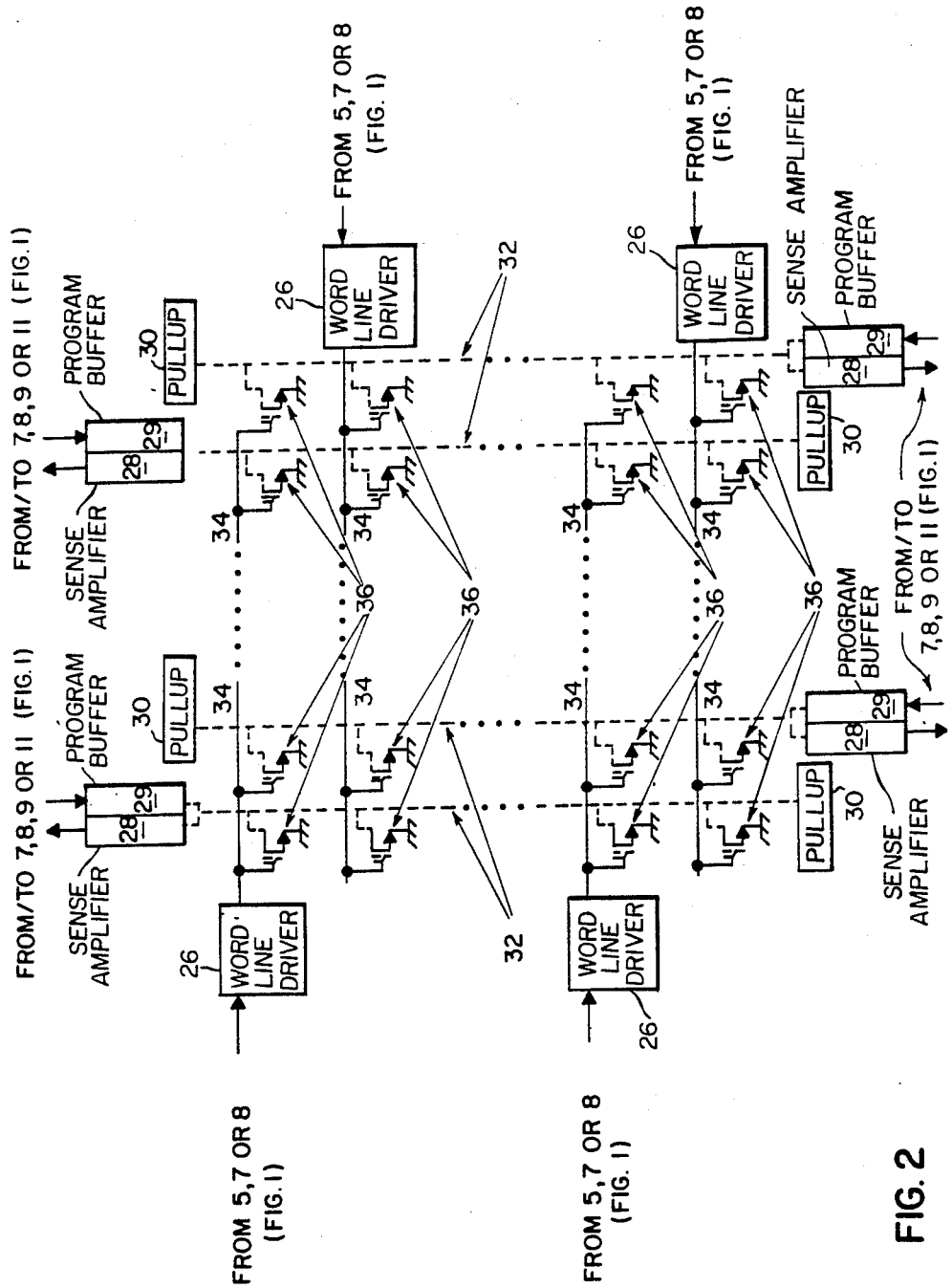
FIG. 2 is a more detailed schematic diagram of the programmable NOR plane array shown in FIG. 1.

A simplified schematic of EPROM array 4 is shown in FIG. 2. If the signal on any work line 34 (driven by a work line driver 26) intersecting an unprogrammed EPROM transistor 36 is high, that transistor will turn on and pull its intersecting bit line 32 low. Since a plurality of EPROM transistors 36 is physically connected together via a common bit line 32, pullup circuit 30 and sense amplifier 28, the output of the sense amplifier 28 provides a NOR function. When an EPROM transistor 36 becomes programmed, its threshold voltage becomes too high for the word line voltage to overcome and thus the transistor is electrically removed from the circuit. Consequently, a given bit line 32 will realize the wired NOR function for only those intersecting word lines 34 whose EPROM transistors 36 are unprogrammed. As well understood by those skilled in the art, such EPROM transistors may be put into the unprogrammed state by exposure to ultraviolet light or by some other means.

Programming of each EPROM transistor 36 is achieved by application of the correct combination of voltages on the corresponding program buffer 29 and word line driver 26. In typical prior art EPROM arrangements, address decoding permits many bit lines to be multiplexed to one sense amplifier; thus an elaborate design may be used for the sense amplifier. In the EPROM arrays of this invention, the outputs of all bit lines must be sensed simultaneously, so one sense amplifier 28 is required for each bit line 32. Similarly, a program buffer 29 is required on each bit line for use in programming. Consequently, the bit line pitch (bit line spacing) is determined by the combined pitch of the sense amplifiers 28 and the program buffers 29 rather than by the EPROM transistor's pitch. Similarly, the word line pitch is determined by the pitch of the word line driver circuits 26. Thus, to minimize EPROM array size (and resultant chip size), word line drive circuits 26 as well as sense amplifiers 28 and program buffers 29 are interleaved from opposite sides (see FIG. 2), permitting a more dense placement of these circuits on all four sides of the EPROM array 4 rather than on just two adjacent sides.

Figure 3:
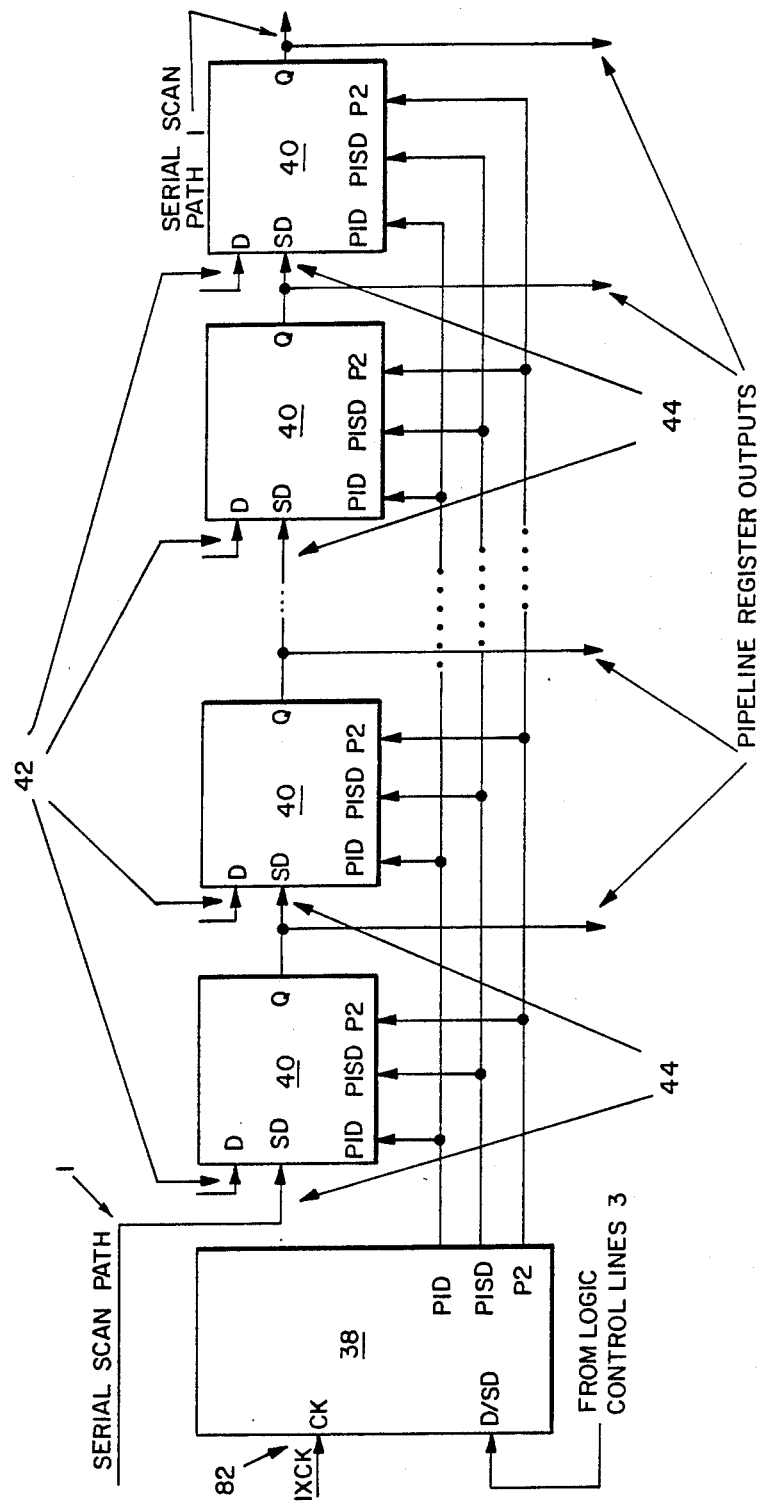
FIG. 3 is a detailed schematic of the pipeline registers shown in FIG. 1.

Surrounding the EPROM arrays are the pipeline registers 5, 7, 8, 9, and 11. These registers include scan-in type D flip flops 40 and a two phase clock generator 38 as shown in FIG. 3. These registers provide three different functions.

First, programming an EPROM transistor 36 requires the simultaneous application of specific voltages to the bit lines 32 and word lines 34 of the device. Every word line driver 26 and every program buffer 29 receive inputs directly from one of the pipeline registers 5, 7, 8, 9, and 11. Once the correct inputs are set up by serially shifting data into these registers, logic control lines 3 (FIG. 1) enable programming voltages to be applied. FIG. 1 illustrates a serial scan path 1 for this program data to be loaded into the pipeline register. A serial scan path is a means of reconfiguring a set of flip flops into a serial shift register for the purpose of shifting data into or out of such flip flops. The serial scan path 1 is shown in FIG. 1.

A more detailed schematic of each pipeline register 5, 7, 8, 9, and 11 is provided in FIG. 3. Each register contains a two phase clock generator 38 which drives a plurality of two-input D flip flops 40. The data lines are connected to the D inputs of scan-in D flip flops 40, from other portions of the integrated circuit and are used to bring in data bits in parallel from external data lines 5 or from another EPROM array 2, 4, or 6 (See FIG. 1). The serial data inputs, SD, of the scan-in D flip flops, 40, are used to shift in data along the serial scan path 1. The D/SD pin of the two phase clock generator, 38 is used to reconfigure the pipeline resister into a serial shift register when the device is put into a program mode. This pin state can be decoded from the logic control lines 3 shown in FIG. 1. As indicated in FIG. 1, the pipeline registers 5, 7, 8, 9, and 11 are serially connected to each other. Word line 34 and bit line 32 data may be serially shifted into the pipeline registers 5, 7, 8, 9, and 11 to enable programming on selected EPROM transistors 36. Appropriate EPROM programming voltage signals are then applied to the chip and thus to the selected transistors 36 at any given time.

Finally, in normal operation, the D input of each D flip flop 40 is used to pipeline data. The PISD pin of the two phase clock generator 38 is used to clock in serial data when the pipeline registers are operating in scan mode. This signal is disabled by application of the proper level to the D/SD pin the two phase clock generator 38. As shown in FIG. 1, the longest clocked data path starts from a block of pipeline registers 5, goes through only one NOR plane 4, and is latched into another pipeline register 7 or 8. Currently available EPLD designs require data to pass through at least two EPROM arrays before being latched. Moreover, the pipelining between arrays serves to increase the speed of the intergrated circuit.

Figure 4A:
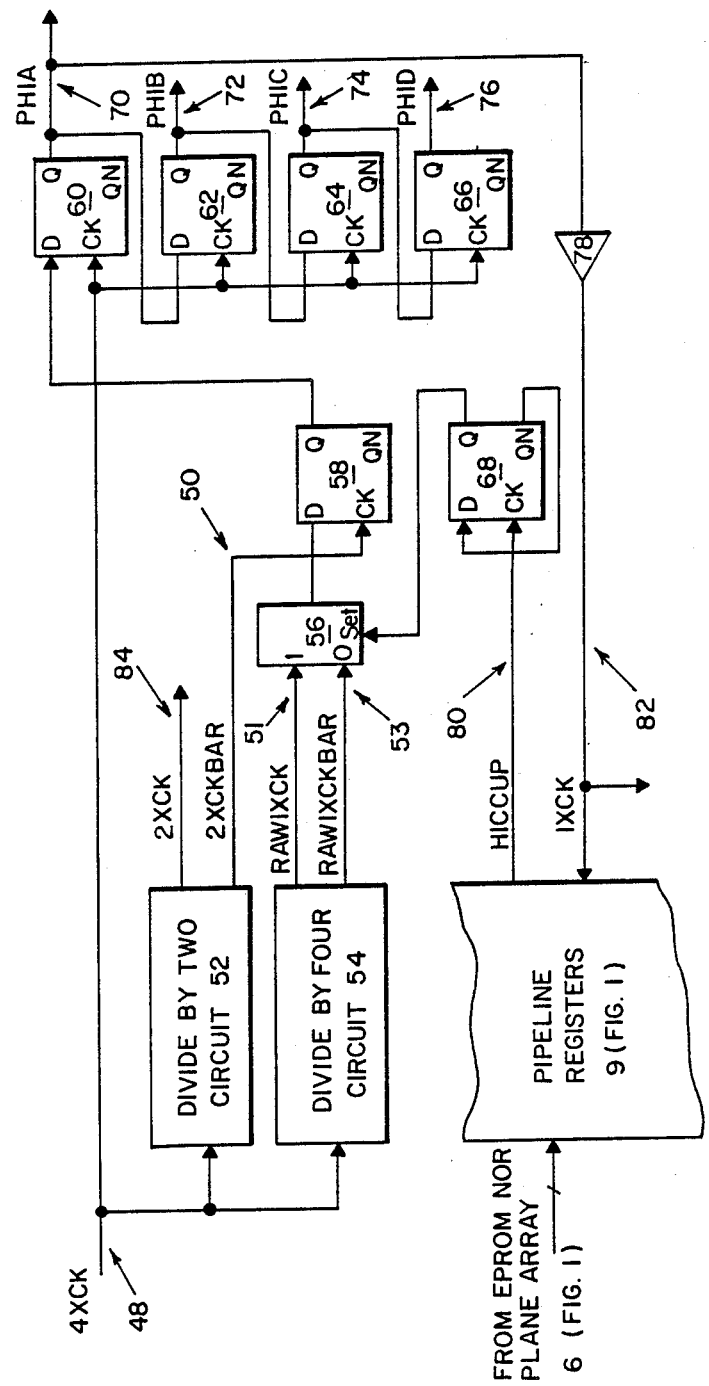
FIG. 4 is a detailed schematic of the "HICCUP circuit" portion of the high speed logic shown in FIG. 1 and a timing diagram for such HICCUP circuit.
Figure 4B:
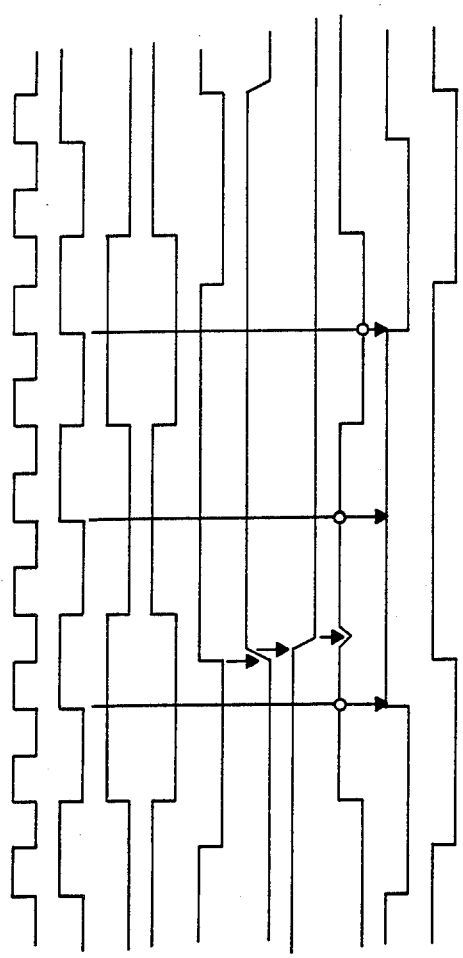
Figure 5:
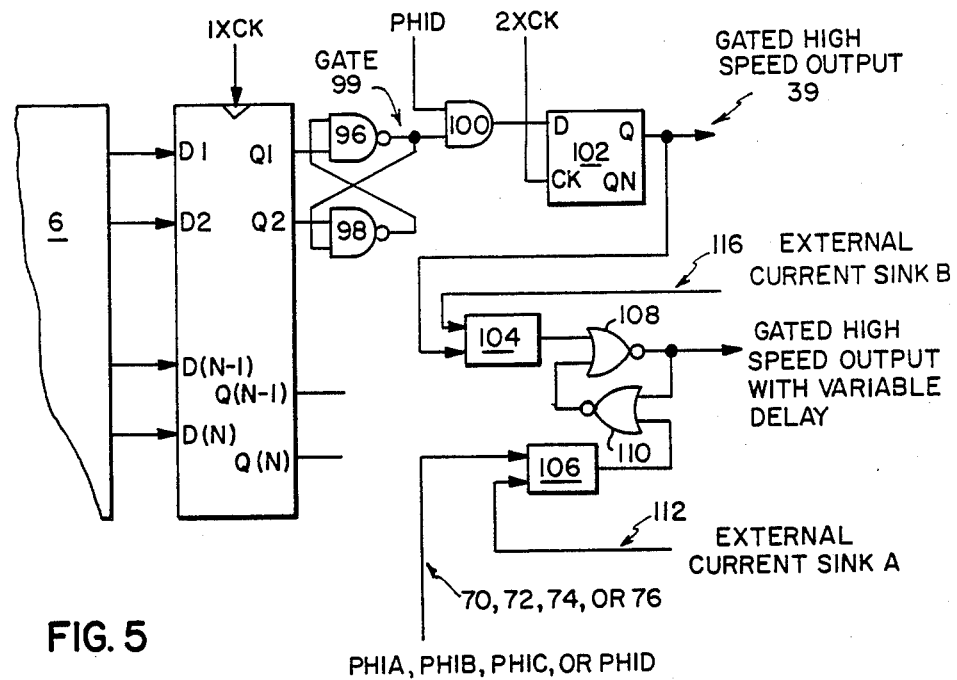
FIG. 5 is a detailed schematic of another portion of the high speed logic shown in FIG. 1.

The high speed logic circuit 10 contains a "HICCUP circuit" which is shown in FIG. 4. This HICCUP circuit extends the period of a low speed clock 1XCK signal 82 by two cycles of a high speed clock 4XCK signal 48. This HICCUP circuit also provides four phases of the 1XCK signal 82 by means of flip flops 60, 62, 64 and 66. These phase PHIA 70, PHIB 72, PHIC 74, and PHID 76 are used in the high speed logic as shown in FIG. 5.

In FIG. 4, a divide by two circuit 52 is synchronized with a divide by four circuit 54 such that every negative edge of a 2XCKBAR signal 50 will correspond with the positive and negative edges of a RAW1XCK signal 51. Further, the signals RAW1XCK 51 and RAW1SC-KBAR53 are compliments of each other. The programmed state of the EPROM array 6 and the state of the inputs to this array determine whether the HICCUP signal 80 will go from low to high in response to the clocking of the pipeline register 9 by the 1XCK signal 82. Eventually, the Q output of flip-flop 68 will be high, causing the RAW1XCK signal 51 to be connected to the D input of flip-flop 58 via a MUX 56. Then, in response to a positive edge of the 4XCK signal 48, the RAW1XCK signal 51 will change from low to high, causing the output of the MUX 56 to go high. On the next positive edge of the 2XCKBAR signal, the Q output of flip-flop 58 will go from low to high in response to the output of the MUX 56 being high. On the next positive edge of the 4XCK signal 48, the Q output of flip-flop 60 and the 1XCK signal 82 will both go from low to high in response to the Q output of flip-flop 58 being high. This positive transition of the 1XCK signal 82 clocks the pipeline register 9. When the HICCUP signal 80 changes from low to high, flip-flop 68 will toggle, causing the MUX 56 to disconnect the RAW1XCK signal 51 and connect the RAW1SCK-BAR signal 53 to the D input of flip-flop 58. At this time, the RAW1XCKBAR signal 53 will go high for the next two cycles of the 4XCK signal 48, causing the D input of flip-flop 58 to remain high during these two cycles, which in turn extends the high period of the 1XCK signal 80 and the Q outputs of flip-flops 58 and 60 by two cycles of the 4XCK signal 48.

Thus, whenever the HICCUP signal 80 goes from low to high in response to a positive edge of the 1XCK signal 82, the 1XCK 82 will have its high period extended by two cycles of the 4XCK signal 48. This is useful, since it allows the cycle time of pipeline registers to be extended by two cycles of the 4XCK 48, thus giving them a resolution of two periods of the 4XCK signal 48 rather than of four periods of the 4XCK signal 48. This is of particular value in realizing the timing requirements for systems for certain television standards, for example, NTSC in which the system clock rate when chosen to be a multiple of the color subcarrier frequency results in an odd number of half cycles of the color subcarrier for the line time. The extra half cycle each line can then be easily accommodated.

The high speed logic 10 also uses the lower speed logic 4, 5, 6, 7, 9, and 14 to selectively gate higher speed timing signals. This is illustrated in FIG. 5. EPROM NOR plane array 6 is shown providing inputs D1 through D(N) to pipeline registers 9. The lower speed pipeline registers 9 are clocked at the 1XCK signal 82 rate. Outputs Q1 and Q2 of the pipeline registers 9 are shown driving an SR flip flop consisting of NAND gates 96 and 98. The output of this SR flip flop is the gate signal 99 which is an input of AND gate 100. The other input of AND gate 100 is driven by the PHID signal 76, which changes at a 2XCK signal 82 rate although shifted in phase. Since a D flip flop 102 is clocked at the 2XCK signal 84 rate, its output, which is a gated high speed output signal 39, can switch twice as often as the outputs of gates 96 and 98. The output of D flip flop 102 can be switched on or off by programming EPROM NOR plane array 6 with the appropriate information to control gates 96 and 98.

Figure 6:
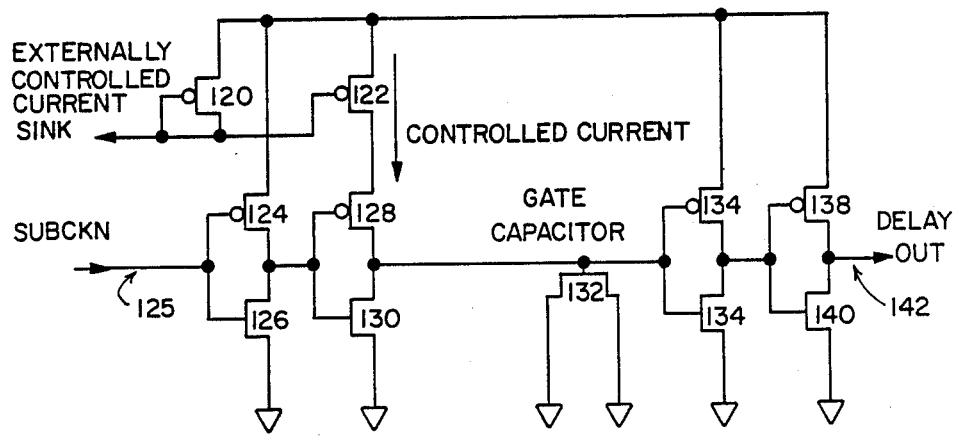
FIG. 6 is a detailed schematic of the analog delay circuit shown in FIG. 1.

A feature of the invention is the inclusion of "on chip" analog delay circuits 104 and 106 which an be used to smoothly position the edges of high speed signals with respect to each other. Turning to FIG. 6 the analog delay circuits are specially constructed buffer circuits designed to apply calibrated delays to rising edge inputs only. This is done by using an externally controlled current sink and connecting it to transistors 120 and 122. The external current is then mirrored by transistor 122 to provide a controlled current source. Transistors 124, 126, 128 and 130 make up an input buffer circuit. When a SUBCKN signal 125 is low, transistor 130 pulls down hard with a large current to discharge a gate capacitor of the transistor 132. As a result, the DELAY OUT signal 142 goes low almost instantaneously, except for a minor delay through an output buffer circuit consisting of transistors 134, 136, 138, and 140. When the SUBCKN signal goes high, transistor 128 turns on, thus charging the gate of transistor 132. Since the current to transistor 128 is provided by transistor 122, the charging time of the gate of transistor 132 is controlled by adjustment of the external current sink which is connected to transistors 120 and 122.

Referring again to FIG. 5, it will be understood that a rising input to analog delay 106 will result in a gated OUTPUT signal 114 going high after a variable delay with respect to the signals PHIA 70, PHIB 72, PHIC 74, or PHID 76. This first delay is controlled by an external current sink A 112. At this point in time, the output of gate 110 will be low. A separate external current sink B 116 is used to control analog delay 104. With the proper delay value in analog delay 104, the output of NOR gate 110 will go high some time later, forcing gated output signal with variable delay signal, 114 low. Accordingly, gated output signal with variable delay signal, 114 can be set high at any time with respect to the signals PHIA 70, PHIB 72, PHIC 74, or PHID 76 and the time at which the gated output signal with variable delay signal, 114 is reset low can be independently controlled by the analog delay 104.

The invention has been described in detail with particular reference to certain preferred embodiments thereof, but it will be understood that variations and modifications can be effected witin the spirit and scope of the invention.

We claim:

1. A programmable integrated circuit for generating timing signals for use with an area image sensor or the like, comprising:
   (a) a clocked pipeline register responsive to a plurality of external signals for providing word line signals;
   (b) at least one EPROM array responsive to the word line signals for selectively providing a plurality of different functions of the word lines to produce output signals; and
   (c) high speed logic responsive to these output signals and a clock signal at a first rate, said high speed logic producing a second clock signal at an integer divisor of the first clock signal rate to clock the pipeline register, and also producing additional clock signals which are derived at the first rate or integer divisors of the first rate which are selectively controlled by the output signals of the EPROM array.

2. A programmable integrated circuit for generating timing signals for an area image sensor or the like, comprising:
   (a) a clocked pipeline register responsive to a plurality of external signals for providing word line signals;
   (b) at least one EPROM array responsive to the word line signals for selectively providing a plurality of different functions of the word lines to produce output signals; and
   (c) high speed logic responsive to these output signals and a clock signal at a first rate, said high speed logic producing a second clock signal at an integer divisor of the first clock signal rate to clock the pipeline register, and also producing additional clock signals which are derived at the first rate or integer divisors of the first rate which are selectively controlled by the output signals of the EPROM array; and
   (d) said EPROM array selectively producing a cycle extension signal, said high speed logic circuit extending a particular cycle of the second clock signal.

3. A programmable integrated circuit for generating timing signals for an area image sensor or the like, comprising:
   (a) a clocked pipeline register responsive to a plurality of external signals for providing word line signals;
   (b) at least one EPROM array responsive to the word line signals for selectively providing a plurality of different functions of the word lines signals to produce output signals;
   (c) high speed logic responsive to these output signals and a clock signal at a first rate, said high speed logic producing a second clock signal at an integer divisor of the first clock signal rate to clock the pipeline register, and also producing additional clock signals which are derived at the first rate or integer divisors of the first rate which are selectively controlled by the output signals of the EPROM array; and
   (d) adjustable delay means coupled to the high speed logic for delaying the high speed logic outputs by adjustable amounts.

4. A programmable integrated circuit for generating timing signals for use with an area image sensor or the like, comprising:
   (a) a first pipeline register responsive to a plurality of internal feed back signals and a plurality of external signals for providing a first set of word line signals;
   (b) a first EPROM array responsive to the first set of word line signals for selectively providing a plurality of different functions of the word lines to produce a first and second set of bit line signals;
   (c) a second pipeline register responsive to the first set of bit line signals which produces a second set of word line signals;
   (d) a third pipeline register responsive to the second set of bit line signals which produces a third set of word line signals;
   (e) a second EPROM array responsive to the second set of word line signals which produces a third set of bit line signals;
   (f) a third EPROM array responsive to the third set of word line signals which produces a fourth set of bit line signals;
   (g) an additional pipeline register or plurality of registers responsive to the third and fourth sets of bit line signals which produce a first set of external output signals and a plurality of control signals;
   (h) SR slip-flops responsive to a second subset of said control signals which produce a set of internal feedback signals to the first EPROM array;
   (i) SR flip-flops responsive to a second subset of said control signals which produces a second set of external output signals;
   (j) SR flip-flops responsive to a third subset of said control signals which produces a set of gating signals;
   (k) high speed logic responsive to a fourth subset of said control signals and to said gating signals which receives a clock signal at a first rate, said high speed logic producing a second clock signal at an integer divisor of the first clock signal rate to clock the pipeline registers, and also producing additional clock signals which are derived at the first rate or integer divisors of the first rate which are selectively controlled by the output signals of the EPROM array; and
   (l) adjustable delay means coupled to the high speed logic for delaying the high speed logic outputs by adjustable amounts.

* * * * *